United States Patent
Kikuchi et al.

(10) Patent No.: US 9,925,571 B2
(45) Date of Patent: Mar. 27, 2018

(54) METHOD OF CLEANING SUBSTRATE PROCESSING APPARATUS

(71) Applicant: Tokyo Electron Limited, Tokyo (JP)

(72) Inventors: Akihiro Kikuchi, Miyagi (JP); Mitsuhiro Tomura, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 651 days.

(21) Appl. No.: 14/316,982

(22) Filed: Jun. 27, 2014

(65) Prior Publication Data

US 2015/0007857 A1    Jan. 8, 2015

(30) Foreign Application Priority Data

Jul. 8, 2013   (JP) ................................ 2013-142981

(51) Int. Cl.
| | |
|---|---|
| B08B 9/00 | (2006.01) |
| H01L 21/02 | (2006.01) |
| H01J 37/32 | (2006.01) |

(52) U.S. Cl.
CPC .......... B08B 9/00 (2013.01); H01J 37/32449 (2013.01); H01J 37/32541 (2013.01); H01J 37/32862 (2013.01)

(58) Field of Classification Search
USPC ....................................................... 134/1.1
See application file for complete search history.

(56) References Cited

U.S. PATENT DOCUMENTS

| | | | |
|---|---|---|---|
| 2006/0157445 A1* | 7/2006 | Mochiki ............. | H01J 37/3244 216/59 |
| 2009/0139540 A1* | 6/2009 | Lau ........................ | B08B 7/0035 134/1.1 |
| 2011/0114113 A1* | 5/2011 | Honda .................. | B08B 7/0035 134/1.1 |
| 2013/0087174 A1* | 4/2013 | Sun .......................... | B08B 5/00 134/30 |

FOREIGN PATENT DOCUMENTS

JP        2007-214512        8/2007

\* cited by examiner

*Primary Examiner* — Katelyn B Whatley
(74) *Attorney, Agent, or Firm* — IPUSA, PLLC

(57) ABSTRACT

A method of cleaning a substrate processing apparatus including a gas supply part configured to eject a process gas via gas passages formed in the gas supply part, and divided into first and second regions corresponding to first and second in-plane positions of a substrate, respectively, includes cleaning a first one of the gas passages corresponding to the first region with the plasma of the process gas by causing a first flow rate of the process gas supplied to the first region to be lower than a second flow rate of the process gas supplied to the second region and cleaning a second one of the gas passages corresponding to the second region with the plasma by causing a third flow rate of the process gas supplied to the first region to be higher than a fourth flow rate of the process gas supplied to the second region.

15 Claims, 3 Drawing Sheets

FIG.4A
FIG.4B
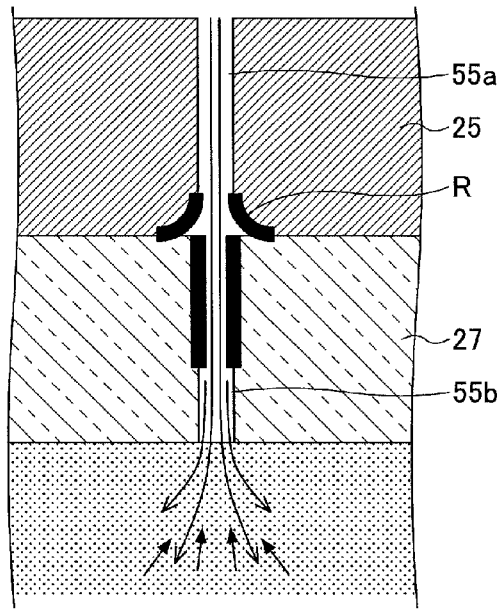
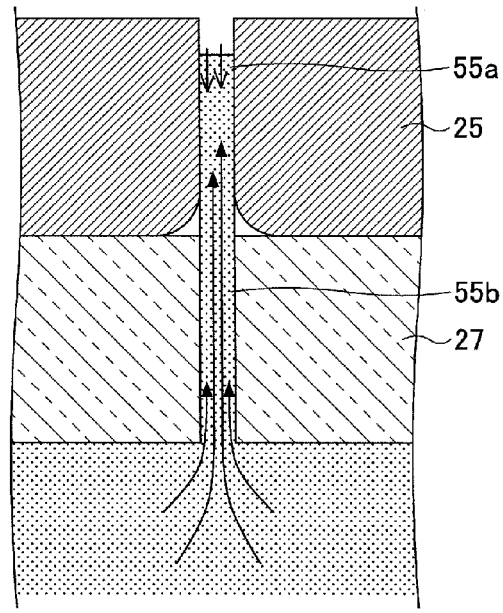
FIG.5
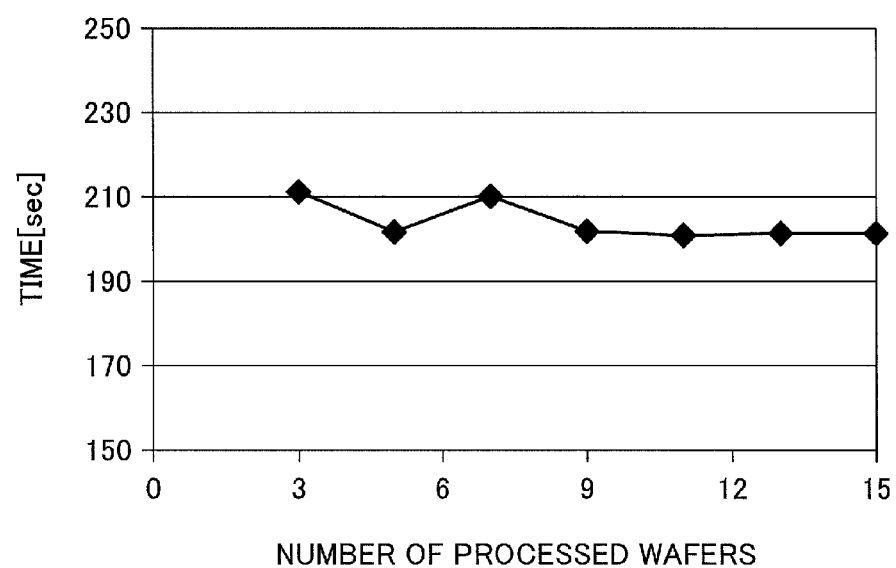

a patent document page

METHOD OF CLEANING SUBSTRATE PROCESSING APPARATUS

CROSS-REFERENCE TO RELATED APPLICATION

This application is based upon and claims the benefit of priority of Japanese Patent Application No. 2013-142981, filed on Jul. 8, 2013, the entire contents of which are incorporated herein by reference.

BACKGROUND OF THE INVENTION

1. Field of the Invention

The present invention relates to cleaning methods and substrate processing apparatuses.

2. Description of the Related Art

Plasma processing apparatuses that perform predetermined plasma processing such as etching on substrates such as wafers for semiconductor devices using plasma are widely known as substrate processing apparatuses.

The plasma processing apparatus includes, for example, a process chamber in which a plasma is generated, an upper electrode and a lower electrode provided to face each other, and a gas supply part that supplies a process gas into a space between the upper electrode and the lower electrode through gas supply holes. High-frequency electric power is applied to at least one of the upper electrode and the lower electrode provided to face each other, and a process gas is excited by the electric field energy to generate a plasma, so that plasma processing is performed on a substrate with the generated discharge plasma.

In the case of using a depositive reaction gas as a process gas in the plasma processing apparatus, a reaction product generated from the process gas adheres to the internal surfaces (inner walls) of the process chamber and the gas supply holes. The adhesion of the reaction product causes a manufactured semiconductor device to be defective because of the adhesion of particles and causes a failure of the plasma processing apparatus. Therefore, as illustrated in, for example, Japanese Laid-Open Patent Application No. 2007-214512, a cleaning process for removing the reaction product that has adhered to the inside of the process chamber is performed at regular intervals.

SUMMARY OF THE INVENTION

According to an aspect of the present invention, a method of cleaning a substrate processing apparatus including a gas supply part configured to eject a process gas into a space between a holding part configured to hold a substrate and an electrode plate in a process chamber via a plurality of gas passages formed in the gas supply part, and divided into a first region corresponding to a first in-plane position of the substrate and a second region corresponding to a second in-plane position of the substrate different from the first in-plane position; and a high-frequency power supply configured to convert the process gas in the space into a plasma includes cleaning a first gas passage of the plurality of gas passages corresponding to the first region with the plasma of the process gas by causing a first flow rate of the process gas supplied to the first region to be lower than a second flow rate of the process gas supplied to the second region, and cleaning a second gas passage of the plurality of gas passages corresponding to the second region with the plasma of the process gas by causing a third flow rate of the process gas supplied to the first region to be higher than a fourth flow rate of the process gas supplied to the second region.

According to an aspect of the present invention, a substrate processing apparatus includes a process chamber, a holding part provided in the process chamber and configured to hold a substrate, an electrode plate provided opposite the holding part in the process chamber, a gas supply source configured to supply a process gas, a gas supply part divided into a first region corresponding to a first in-plane position of the substrate and a second region corresponding to a second in-plane position of the substrate different from the first in-plane position, and configured to eject the process gas from the gas supply source into a space between the holding part and the electrode plate via a plurality of gas passages formed in the gas supply part, a high-frequency power supply configured to convert the process gas in the space into a plasma by supplying high-frequency electric power to at least one of the holding part and the electrode plate, and a control part configured to control an operation of the substrate processing apparatus so as to execute a process including cleaning a first gas passage of the plurality of gas passages corresponding to the first region with the plasma of the process gas by causing a first flow rate of the process gas supplied to the first region to be lower than a second flow rate of the process gas supplied to the second region, and cleaning a second gas passage of the plurality of gas passages corresponding to the second region with the plasma of the process gas by causing a third flow rate of the process gas supplied to the first region to be higher than a fourth flow rate of the process gas supplied to the second region.

The object and advantages of the invention will be realized and attained by means of the elements and combinations particularly pointed out in the claims.

It is to be understood that both the foregoing general description and the following detailed description are exemplary and explanatory and not restrictive of the invention.

BRIEF DESCRIPTION OF THE DRAWINGS

Other objects, features and advantages of the present invention will become more apparent from the following detailed description when read in conjunction with the accompanying drawings, in which:

FIGS. 4A and 4B are schematic diagrams for illustrating an effect of the cleaning method according to the embodiment; and FIG. 5 is a schematic diagram for illustrating end point detection of the cleaning method according to the embodiment.

DETAILED DESCRIPTION OF THE PREFERRED EMBODIMENTS

Figure 1:
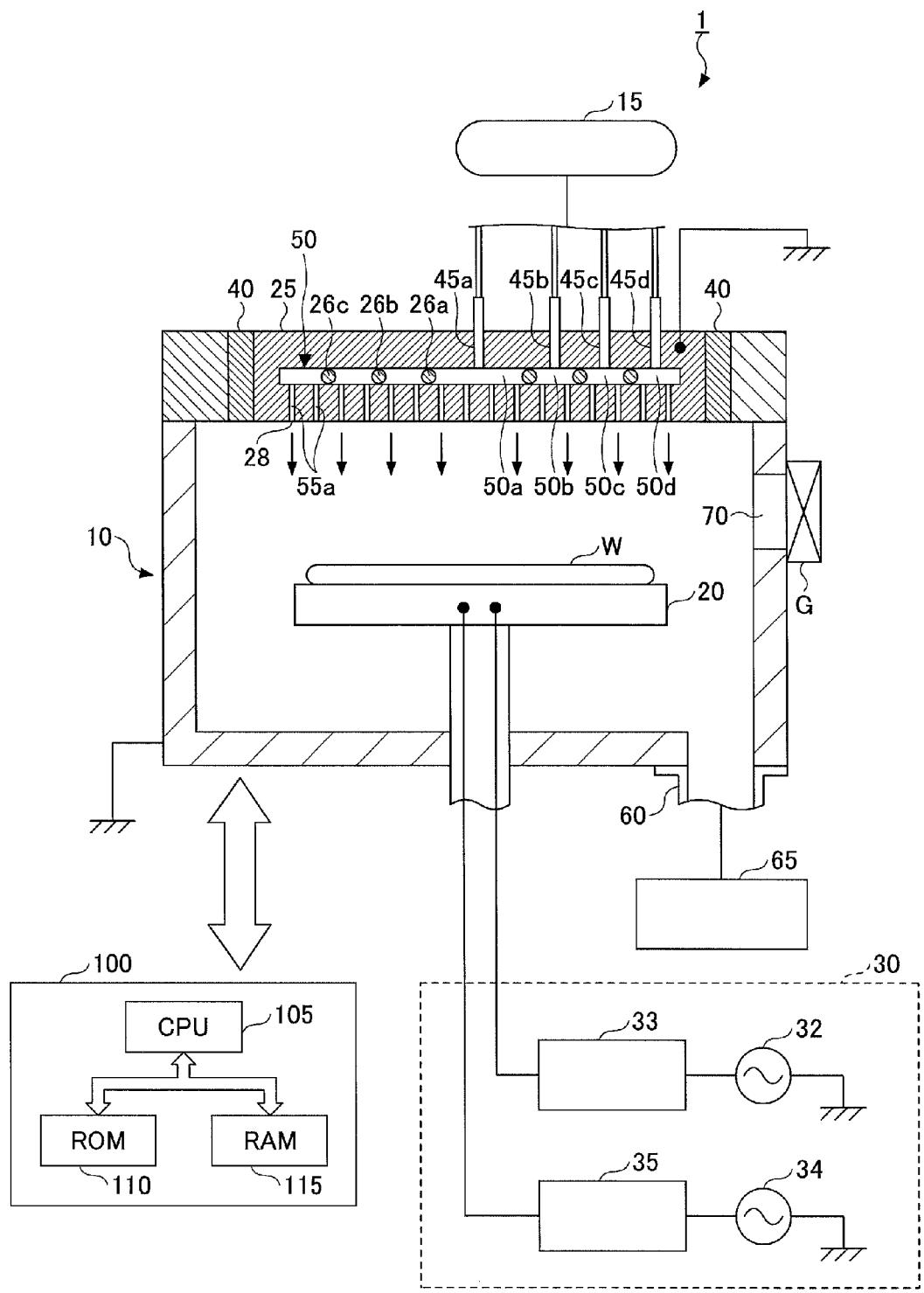
FIG. 1 is a schematic diagram illustrating a configuration of a substrate processing apparatus according to an embodiment.

As mentioned above, Japanese Laid-Open Patent Application No. 2007-214512 illustrates performing a cleaning process for removing the reaction product at regular intervals. The method of Japanese Laid-Open Patent Application No. 2007-214512, however, has the problem of being less effective in cleaning a reaction product adhering to gas passages and gas supply holes of a gas supply part that supplies a process gas.

According to an aspect of the present invention, a cleaning method effective in removing a reaction product adhering to gas passages, gas supply holes, and the process chamber of a substrate processing apparatus is provided.

A description is given, with reference to the accompanying drawings, of an embodiment of the present invention. In the specification and the drawings, configurations that are substantially equal are referred to by the same reference numeral, and are not repetitively described.

[Substrate Processing Apparatus]

First, a description is given of a configuration of a substrate processing apparatus capable of executing a cleaning method according to this embodiment. Substrate processing apparatuses capable of executing a cleaning method according to this embodiment, which are not limited in particular, include, for example, parallel plate (capacitive coupled) plasma processing apparatuses capable of performing plasma processing such as reactive ion etching (RIE) or ashing on a semiconductor wafer W as an object of processing. While the semiconductor wafer W is described as an object of processing in this specification, examples of objects of processing include various kinds of substrates used for liquid crystal displays (LCDs) and flat panel displays (FPDs), photomasks, CD substrates, and printed boards.

FIG. 1 is a schematic diagram illustrating a configuration of a substrate processing apparatus according to this embodiment.

A substrate processing apparatus 1 includes a process chamber 10 and a gas supply source 15. The process chamber 10 is made of an electrically conductive material such as aluminum. The gas supply source 15 supplies a process gas into the process chamber 10. The process gas is suitably selected in accordance with the type of a process and the type of a film to be processed.

The process chamber 10 is electrically grounded. A lower electrode 20 (corresponding to a holding part) and an upper electrode 25 (corresponding to an electrode plate) are provided inside the process chamber 10. The upper electrode 25 is placed opposite and parallel to the lower electrode 20.

The lower electrode 20 serves also as a placement table for placing the semiconductor wafer W (hereinafter referred to as "wafer W") on which a single layer film or a multilayer film is formed, which is an object of processing.

An electric power supplying unit 30 that supplies dual frequency superimposed electric power is connected to at least one of the lower electrode 20 and the upper electrode 25 (to the lower electrode 20 in FIG. 1). The electric power supplying unit 30 includes a first high-frequency power supply 32 and a second high-frequency power supply 34. The first high-frequency power supply 32 supplies first high-frequency electric power of a first frequency (high-frequency electric power for plasma generation). The second high-frequency power supply 34 supplies second high-frequency electric power of a second frequency lower than the first frequency (high-frequency electric power for bias voltage generation). The first high-frequency power supply 32 is electrically connected to the lower electrode 20 via a first matching device 33. The second high-frequency power supply 34 is electrically connected to the lower electrode 20 via a second matching device 35.

The first matching device 33 and the second matching device 35 are for matching load impedance with the internal (output) impedance of the first high-frequency power supply 32 and the second high-frequency power supply 34, respectively. The first matching device 33 and the second matching device 35 operate so that the internal impedance and the load impedance have an apparent impedance match with respect to each of the first high-frequency power supply 32 and the second high-frequency power supply 34 when a plasma is generated in the process chamber 10.

The upper electrode 25 is attached to a ceiling part of the process chamber 10 through a shield ring 40 that covers a peripheral edge part of the upper electrode 25. The upper electrode 25 may be electrically grounded as illustrated in FIG. 1. Alternatively, the upper electrode 25 may be connected to a variable direct-current (DC) power supply (not illustrated) so as to allow a predetermined DC voltage to be applied to the upper electrode 25.

A diffusion chamber 50 that diffuses gas introduced from the gas supply source 15 described below is provided in the upper electrode 25. In the diffusion chamber 50, one or more annular partition wall members each formed of an O-ring are provided. The annular partition wall members are provided at different positions in a radial direction of the upper electrode 25, that is, at different positions in a plane direction of the wafer W to be processed. In the case illustrated in FIG. 1, a first annular partition wall member 26a, a second annular partition wall member 26b, and a third annular partition wall member 26c are radially arranged in this order from the center side of the upper electrode 25. As a result, the diffusion chamber 50 is divided into a first diffusion chamber 50a, a second diffusion chamber 50b, a third diffusion chamber 50c, and a fourth diffusion chamber 50d from the center side. In this case, the first diffusion chamber 50a, the second diffusion chamber 50b, the third diffusion chamber 50c, and the fourth diffusion chamber 50d are formed in correspondence to, for example, a center part, a middle part, an edge part, and a very edge (outer edge) part, respectively, of the wafer W to be processed.

The number of annular partition wall members is not limited in particular as long as there is at least one annular partition wall member. For example, by providing n annular partition wall members, it is possible to provide the diffusion chamber 50 divided into n+1 diffusion chambers. In the following description, the annular partition wall members 26a through 26c may also be collectively referred to as "annular partition wall members 26" where there is no need to distinguish one from another among the annular partition wall members 26a through 26c.

Gas introduction ports 45a, 45b, 45c and 45d are formed for the diffusion chambers 50a, 50b, 50c and 50d, respectively. Various kinds of process gases may be introduced from the gas supply source 15 into the diffusion chambers 50a through 50d via the gas introduction ports 45a through 45d, respectively.

A large number of gas passages 55a for supplying a process gas from the diffusion chamber 50 into the process chamber 10 are formed in the upper electrode 25 as illustrated in FIG. 1.

Figure 2:
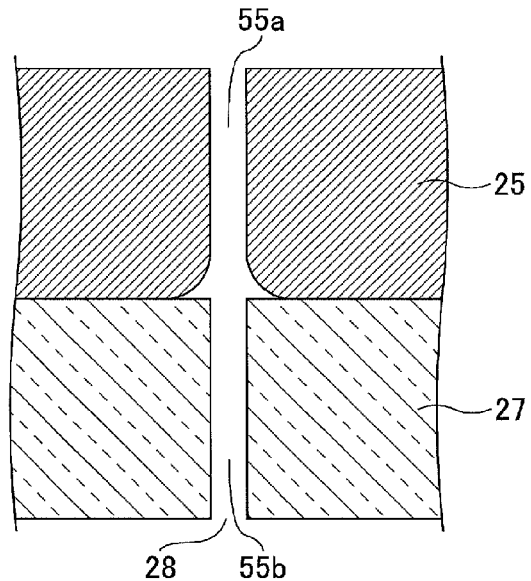
FIG. 2 is a schematic enlarged view of a gas passage and its vicinity of the substrate processing apparatus of FIG. 1.

FIG. 2 is a schematic enlarged view of one of the gas passages 55a and its vicinity of the substrate processing apparatus 1 of FIG. 1. Although not illustrated in FIG. 1, a cover member 27 made of an insulating ceramic such as quartz for protecting the upper electrode 25 from a plasma and damage and for preventing metal contamination is provided on a surface of the upper electrode 25 facing toward the lower electrode 20 as illustrated in FIG. 2. Gas passages 55b that correspond to the above-described gas passages 55a of the upper electrode 25 are formed in the cover member 27. Part of each gas passage 55a of the upper electrode 25 close to the cover member 27 increases in hole diameter. As a result, it is possible to reduce the mixture of a leakage gas from outside.

A process gas from the gas supply source 15 is first distributed and supplied to the diffusion chambers 50a through 50d via the gas introduction ports 45a through 45d, respectively. Then, the process gas supplied to the diffusion chamber 50 (the diffusion chambers 50a through 50d) is supplied into the process chamber 10 via the gas passages 55a and 55b and via gas supply holes 28 formed in the cover member 27. Thus, the upper electrode 25 of the above-described configuration operates also as a gas shower head that supplies a process gas.

An evacuation port 60 is formed at the bottom surface of the process chamber 10. It is possible to maintain a predetermined degree of vacuum inside the process chamber 10 by evacuating the process chamber 10 by an evacuation unit 65 connected to the evacuation port 60.

A gate valve G is provided on a sidewall of the process chamber 10. The gate valve G opens and closes a transfer port 70 when the wafer W is transferred into and out of the process chamber 10.

Furthermore, magnets that extend annularly or concentrically, which are not illustrated in the drawings, may be provided, for example, one above the other around the process chamber 10. In the case of providing magnets, an RF electric field is vertically formed and a magnetic field is horizontally formed by high-frequency electric power in a space between the lower electrode 20 and the upper electrode 25. It is possible to form a high-density plasma near the surface of the lower electrode 20 by magnetron discharge using these perpendicularly crossed electric and magnetic fields. The substrate processing apparatus 1 includes a control part 100 that controls the apparatus operation. The control part 100 includes a central processing unit (CPU) 105, and a read-only memory (ROM) 110 and a random access memory (RAM) 115 as storage areas. The CPU 105 executes various kinds of plasma processing (such as cleaning, etching, and ashing) in accordance with various kinds of recipes stored in these storage areas. A process time, a pressure (gas evacuation), high-frequency electric power and voltage, the flow rates of various kinds of process gases, and temperatures inside the process chamber 10 (for example, the temperature of the upper electrode 25, the sidewall temperature of the process chamber 10, and an ESC temperature), which are the control information of the substrate processing apparatus 1 with respect to process conditions, are written in the recipes. Programs and recipes indicating process conditions may be stored in a hard disk drive or a semiconductor memory, or contained in a portable computer-readable storage medium such as a CD-ROM or a DVD to be read from the storage medium and loaded to a predetermined position of the storage areas.

[Cleaning Method]

Next, a description is given of a cleaning method according to this embodiment, using the above-described substrate processing apparatus 1. At the time of cleaning based on the cleaning method of this embodiment, the pressure inside the process chamber 10, the output of high-frequency electric power by the electric power supplying unit 30, and a cleaning time may be suitably determined by a person of ordinary skill in the art.

Figure 3:
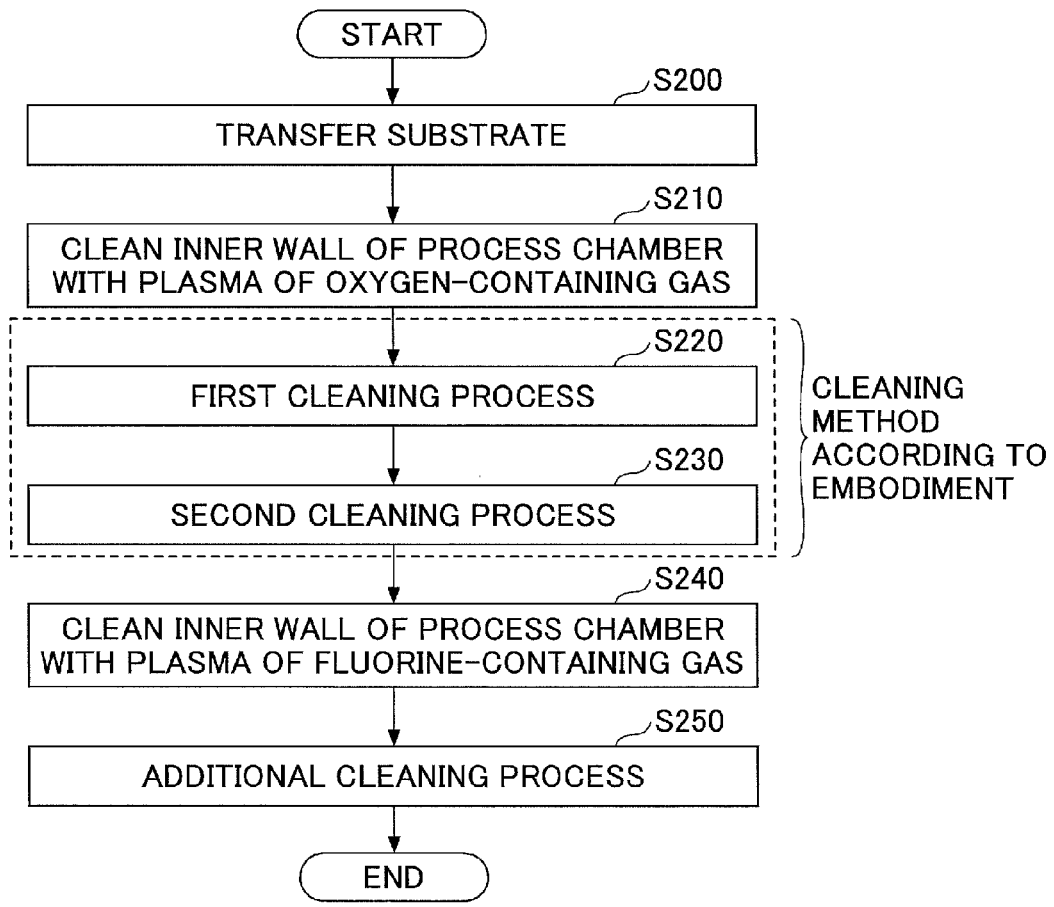
FIG. 3 is a flowchart of a cleaning method according to the embodiment.

FIG. 3 is a flowchart of a cleaning method according to this embodiment.

The cleaning method of this embodiment is executed, for example, after performing plasma processing such as RIE on the wafer W using the above-described substrate processing apparatus 1. A reaction product generated from a process gas at the time of performing plasma processing on the wafer W adheres to the surface of the upper electrode 25, the sidewall of the process chamber 10, and the interior surfaces of the gas supply holes 28. In order to remove this reaction product, the cleaning method as described below is executed. The method of principally removing a reaction product adhering to the surface of the upper electrode 25 and the sidewall of the process chamber 10, which is already known, is also described in this specification.

First, at step S200 of FIG. 3, in the substrate processing apparatus 1, the wafer W subjected to plasma processing is transferred out of the process chamber 10. Alternatively, the cleaning method of this embodiment may be executed with the wafer W being accommodated in the process chamber 10.

Next, at step S210, an oxygen gas plasma is generated by introducing oxygen gas into the process chamber 10 and applying high-frequency electric power for plasma generation to the lower electrode 20. As a result, oxygen radicals (and oxygen ions) are generated from the oxygen gas. The oxygen radicals decompose and remove a reaction product adhering to the inner wall of the process chamber 10 (and the surface of the upper electrode 25) by reacting with the reaction product. The decomposed reaction product and the oxygen radicals are discharged through the evacuation port 60 by the evacuation unit 65 of the substrate processing apparatus 1.

In the process of step S210, however, it is difficult to remove the reaction product adhering to the internal surfaces of the gas supply holes 28. FIGS. 4A and 4B are schematic diagrams for illustrating an effect of a cleaning method according to this embodiment. To be more specific, FIGS. 4A and 4B are schematic diagrams illustrating one of the gas supply holes 28 and its vicinity of the substrate processing apparatus 1. In FIG. 4, downward arrows schematically indicate directions in which a cleaning gas moves, and upward arrows schematically indicate directions in which radicals generated by the plasma of the cleaning gas move. Furthermore, in FIGS. 4A and 4B, a dot pattern schematically indicates an area in which the radicals are distributed.

As illustrated in FIG. 4A, according to a related-art cleaning method, oxygen gas serving as a cleaning gas is supplied from the diffusion chamber 50 into the process chamber 10 via the gas passages 55a and 55b at a high flow rate. Therefore, it is difficult for oxygen radicals generated inside the process chamber 10 to enter the gas passages 55b and 55a from the process chamber 10. Therefore, according to the above-described cleaning at step S210, even if the cleaning is performed for a long time, at least part of a reaction product R adhering onto the gas passages 55a and 55b is unremoved and remains.

Therefore, according to this embodiment, at step S220, a cleaning gas is supplied to the diffusion chamber 50 separated into at least two zones by the annular partition wall members 26 so that the diffusion chamber 50 has a region where the cleaning gas is supplied at a higher flow rate and a region where the cleaning gas is supplied at a lower flow rate. In other words, a cleaning gas is supplied at a first flow rate into a first region of the diffusion chamber 50, separated into at least two zones by the annular partition wall members 26, corresponding to a first in-plane position of the wafer W, and is supplied at a second flow rate higher than the first flow rate into a second region of the diffusion chamber 50 corresponding to a second in-plane position of the wafer W that is different from the first in-plane position. That is, cleaning is performed with the first flow rate being lower than the second flow rate.

As described above with reference to FIG. 4A, it is difficult for radicals generated inside the process chamber 10 to enter the gas passages 55a and 55b from the process chamber 10 at the gas supply holes 28 corresponding to the second region where the cleaning gas is introduced at the second flow rate. On the other hand, as illustrated in FIG. 4B, it is easy for radicals generated inside the process chamber 10 to enter the gas passages 55a and 55b from the process chamber 10 at the gas supply holes 28 corresponding to the first region where the cleaning gas is introduced at the first flow rate lower than the second flow rate. The radicals that have entered the gas passages 55a and 55b decompose and remove the reaction product R adhering onto the internal surfaces of the gas passages 55a and 55b. That is, the gas passages 55a and 55b corresponding to the first region are cleaned by the radicals that have entered.

Next, at step S230, oxygen gas is supplied into the first region at a third flow rate and is supplied into the second region at a fourth flow rate lower than the third flow rate. That is, cleaning is performed with the third flow rate being higher than the fourth flow rate.

As a result, it is possible for oxygen radicals to enter the gas passages 55a and 55b corresponding to the second region, so that the gas passages 55a and 55b corresponding to the second region also are cleaned.

The flow rate ratio between the first flow rate and the second flow rate at which a cleaning gas is supplied at step S220, which is not limited in particular, is preferably within the range of, for example, 0:100 to 40:60. Likewise, the flow rate ratio between the third flow rate and the fourth flow rate at which a cleaning gas is supplied at step S230, which is not limited in particular, is preferably within the range of, for example, 100:0 to 60:40. The flow rate ratio between the first flow rate and the second flow rate may be either equal to or different from the flow rate ratio between the third flow rate and the fourth flow rate. The reaction product R that adheres to the gas passages 55a and 55b differs depending on the process conditions of plasma processing using the substrate processing apparatus 1 of FIG. 1. Therefore, it is desired to sufficiently remove the reaction product R inside the gas passages 55a and 55b by controlling the above-described flow rate ratios and a cleaning time in accordance with the amount of adhesion of the reaction product R.

In this embodiment, the diffusion chamber 50 is divided into at least two zones by the annular partition wall members 26. For example, it is possible to divide the diffusion chamber 50 into two zones corresponding to, for example, a center part and an edge part of the wafer W, using a single annular partition wall member 26. In this case, the first region may correspond to the center part and the second region may correspond to the edge part. Alternatively, the first region may correspond to the edge part and the second region may correspond to the center part.

According to a variation of this embodiment, the diffusion chamber 50 may be divided into three zones corresponding to, for example, a center part, a middle part, and an edge part of the wafer W, using two annular partition wall members 26. In this case, for example, the first region may correspond to the center part and the second region may correspond to the middle part and the edge part, or the first region may correspond to the middle part and the edge part and the second region may correspond to the center part. As an alternative, the first region may correspond to the center part and the middle part and the second region may correspond to the edge part, or the first region may correspond to the edge part and the second region may correspond to the center part and the middle part. As another alternative, the first region may correspond to the center part and the edge part and the second region may correspond to the middle part, or the first region may correspond to the middle part and the second region may correspond to the center part and the edge part.

Furthermore, according to another variation of this embodiment, the diffusion chamber 50 may be divided into four zones corresponding to, for example, a center part, a middle part, an edge part, and a very edge part of the wafer W, using three annular partition wall members 26. In this case as well, the assignment of the first region and the second region may be any combination of the center part, the middle part, the edge part, and the very edge part.

That is, in the case where the diffusion chamber 50 divided into N+1 diffusion chambers by disposing, for example, N annular partition wall members 26 (where N is a natural number) is provided, it is possible for a person of ordinary skill in the art to suitably assign each of the N+1 diffusion chambers to the first region or the second region. When the first flow rate is lower than the second flow rate, first, the gas passages 55a and 55b corresponding to the first region are cleaned at step S220, and then, the gas passages 55a and 55b corresponding to the second region are cleaned at step S230.

The cleaning time at each of steps S220 and S230, which is not limited in particular, is normally about half of the cleaning time of step S210.

At steps S220 and S230, it is possible to not only efficiently clean the gas passages 55a and 55b but also clean the surface of the upper electrode 25 and the sidewall of the process chamber 10 of an adhering reaction product. Therefore, compared with, for example, the related-art cleaning method illustrated at step S210, it is possible to reduce a total cleaning time. Furthermore, according to the cleaning method of this embodiment, it is possible to easily detect an end point with accuracy as described below in a second example.

As an example, a process gas including oxygen gas may be used in the cleaning process by steps S210, S220 and S230. In this case, oxygen ions and oxygen radicals are generated. Therefore, if silicon or the like is used as a material of a component of the substrate processing apparatus 1, the oxygen ions and radicals may react with silicon to generate an oxide such as a silicon oxide ($SiO_2$). The generated oxide adheres to, for example, the surface of the upper electrode 25 and the sidewall of the process chamber 10. Therefore, in this embodiment, it is preferable to introduce a process gas including fluorine-containing gas into the process chamber 10 and cause the plasma of the process gas to be generated by applying high-frequency electric power for plasma generation to the lower electrode 20 at step S240. As a result, fluorine ions and fluorine radicals are generated from the fluorine-containing gas. The fluorine ions and radicals react with and decompose the oxide adhering to the surface of the upper electrode 25 and the sidewall of the process chamber 10. The decomposed reaction product and the fluorine ions and radicals are discharged through the evacuation port 60 by the evacuation unit 65 of the substrate processing apparatus 1.

As the fluorine-containing gas at step S240, for example, a straight-chain saturated fluorocarbon gas expressed by $C_xF_{2x+2}$, such as $CF_4$, $C_2F_6$, or $C_3F_8$, may be used alone or in mixture with other gas.

Then, after step S240, at step S250, a plasma of oxygen gas is generated by introducing oxygen gas into the process chamber 10 and applying high-frequency electric power for plasma generation to the lower electrode 20 as an additional cleaning process. As a result, oxygen radicals (and oxygen ions) are generated from the oxygen gas, so that it is possible to decompose and remove the reaction product and the oxide remaining inside the process chamber 10. The decomposed reaction product and oxide and the ions and radicals are discharged through the evacuation port 60 by the evacuation unit 65 of the substrate processing apparatus 1. Then, the cleaning method of this embodiment ends.

[First Example]

Next, this embodiment is described in more detail based on specific examples. First, a description is given of an example where it has been confirmed that it is possible for the cleaning method of this embodiment to efficiently remove a reaction product adhering to gas supply holes.

A single annular partition wall member 26 was provided in the substrate processing apparatus 1 of FIG. 1 so as to divide the diffusion chamber 50 into two zones, namely, a center part and an edge part, from the center side. Plasma processing was performed on a predetermined number of wafers using this substrate processing apparatus 1. After the plasma processing, the wafers were transferred out of the process chamber 10 (step S200), and cleaning was performed on the substrate processing apparatus 1 after the plasma processing with the following gaseous species and gas flow rate ratios based on the flowchart illustrated in FIG. 3.

Gaseous species and gas flow rate ratios are as follows:
[Gaseous Species and Gas Flow Rate Ratio at Step S210]
  Gaseous Species: $O_2$ gas and He gas
  Gas Flow Rate Ratio:Center Part:Edge Part=50:50
[Gaseous Species and Gas Flow Rate Ratio at Step S220]
  Gaseous Species: $O_2$ gas
  Gas Flow Rate Ratio:Center Part:Edge Part=5:95
[Gaseous Species and Gas Flow Rate Ratio at Step S230]
  Gaseous Species: $O_2$ gas
  Gas Flow Rate Ratio:Center Part:Edge Part=95:5
[Gaseous Species and Gas Flow Rate Ratio at Step S240]
  Gaseous Species: $CF_4$ gas and $O_2$ gas
  Gas Flow Rate Ratio:Center Part:Edge Part=50:50
[Gaseous Species and Gas Flow Rate Ratio at Step S250]
  Gaseous Species: $O_2$ gas and He gas
  Gas Flow Rate Ratio:Center Part:Edge Part=50:50

Furthermore, as a comparative example, related-art cleaning that does not execute steps S220 and S230 was performed with the following conditions using the same substrate processing apparatus 1 as that used in the first example.

Gaseous species and gas flow rate ratios are as follows:
[Gaseous Species and Gas Flow Rate Ratio at Step S210]
  Gaseous Species: $O_2$ gas and He gas
  Gas Flow Rate Ratio:Center Part: Edge Part=50:50
[Gaseous Species and Gas Flow Rate Ratio at Step S240]
  Gaseous Species: $CF_4$ gas and $O_2$ gas
  Gas Flow Rate Ratio: Center Part: Edge Part=50:50
[Gaseous Species and Gas Flow Rate Ratio at Step S250]
  Gaseous Species: $O_2$ gas and He gas
  Gas Flow Rate Ratio: Center Part: Edge Part=50:50

The gas passages 55a and 55b and the gas supply holes 28 formed in the upper electrode 25 and the cover member 27 were visually checked after performing the cleaning method of this embodiment, and no adhesion of the reaction product R was confirmed. On the other hand, the reaction product R remained in the gas passages 55a and 55b after performing the cleaning method according to the comparative example. This has shown that it is possible for the cleaning method of this embodiment to efficiently clean the gas passages 55a and 55b and the gas supply holes 28.

[Second Example]

Next, a description is given of an example where it has been confirmed that it is possible for the cleaning method of this embodiment to stably remove a reaction product.

A single annular partition wall member 26 was provided in the substrate processing apparatus 1 of FIG. 1 so as to divide the diffusion chamber 50 into two zones, namely, a center part and an edge part, from the center side. Plasma processing on a predetermined number of wafers and the same cleaning as in the first example after the plasma processing were repeated using the substrate processing apparatus 1. In the plasma processing, a plasma process that generates a depositive reaction product containing carbon was performed. Furthermore, in the plasma processing, the end point of cleaning was detected by detecting the light emission intensity of carbon monoxide radicals (483 nm) generated by the reaction of the reaction product containing carbon with a plasma of oxygen gas from the emission spectrum of the plasma inside the process chamber 10. In the detection of the end point, a cleaning time in the case where the slope of the light emission intensity relative to time becomes zero was detected.

FIG. 5 is a schematic diagram illustrating the end point detection of a cleaning method according to this embodiment. In FIG. 5, the horizontal axis represents the number of processed wafers W, and the vertical axis represents a cleaning time at the time of detection of the end point.

As illustrated in FIG. 5, according to the cleaning method of this embodiment, the cleaning time at the time of detection of the end point is stable. If the cleaning time at the time of detection of the end point according to a cleaning method is unstable, this means the existence of a reaction product that has not been removed during cleaning. Accordingly, it has been found that the cleaning method according to this embodiment, by which the cleaning time at the time of detection of the end point is stable, is a process capable of stably removing a reaction product even in the case where plasma processing is repeated.

All examples and conditional language provided herein are intended for pedagogical purposes of aiding the reader in understanding the invention and the concepts contributed by the inventors to further the art, and are not to be construed as limitations to such specifically recited examples and conditions, nor does the organization of such examples in the specification relate to a showing of the superiority or inferiority of the invention. Although one or more embodiments of the present invention have been described in detail, it should be understood that the various changes, substitutions, and alterations could be made hereto without departing from the spirit and scope of the invention.

What is claimed is:

1. A method of cleaning a substrate processing apparatus with a plasma of a cleaning gas, the substrate processing apparatus including a gas supply part configured to eject the cleaning gas into a space between a holding part configured to hold a substrate and an electrode plate in a process chamber via a plurality of gas passages formed in the gas supply part, and divided into a first region corresponding to a first in-plane position of the substrate and a second region corresponding to a second in-plane position of the substrate different from the first in-plane position; and a high-frequency power supply configured to convert the cleaning gas in the space into the plasma, the method comprising:

ejecting the cleaning gas into the space through the plurality of gas passages with a first flow rate of the cleaning gas supplied to the first region corresponding to a first gas passage of the plurality of gas passages being lower than a second flow rate of the cleaning gas supplied to the second region corresponding to a second gas passage of the plurality of gas passages; and ejecting the cleaning gas into the space through the plurality of gas passages with a third flow rate of the cleaning gas supplied to the first region being higher than a fourth flow rate of the cleaning gas supplied to the second region, wherein said ejecting the cleaning gas with the first flow rate being lower than the second flow rate and said ejecting the cleaning gas with the third flow rate being higher than the fourth flow rate are performed to clean the first gas passage and the second gas passage, respectively, after performing reactive ion etching on the substrate.

2. The method as claimed in claim 1, wherein
a ratio of the first flow rate and the second flow rate is within a range of 0:100 to 40:60, and
a ratio of the third flow rate and the fourth flow rate is within a range of 100:0 to 60:40.

3. The method as claimed in claim 1, wherein in a case where the substrate is divided into a center part and an edge part from a center side of the substrate, the first in-plane position is one of the center part and the edge part and the second in-plane position is the other of the center part and the edge part.

4. The method as claimed in claim 1, wherein in a case where the substrate is divided into a center part, a middle part, and an edge part from a center side of the substrate, the first in-plane position is one or two of the center part, the middle part, and the edge part, and the second in-plane position is the rest of the center part, the middle part, and the edge part.

5. The method as claimed in claim 1, wherein in a case where the substrate is divided into a center part, a middle part, an edge part, and a very edge part from a center side of the substrate, the first in-plane position is one, two or three of the center part, the middle part, the edge part, and the very edge part, and the second in-plane position is the rest of the center part, the middle part, the edge part, and the very edge part.

6. The method as claimed in claim 1, wherein a carbon-containing deposit adhering to at least one of the first gas passage and the second gas passage is removed by the method, and the cleaning gas includes oxygen gas.

7. The method as claimed in claim 1, further comprising:
cleaning at least an inner wall of the process chamber with the plasma of the cleaning gas before said ejecting the cleaning gas with the first flow rate being lower than the second flow rate,
wherein the cleaning gas includes oxygen.

8. The method as claimed in claim 7, wherein a flow rate of the cleaning gas supplied to the first region and a flow rate of the cleaning gas supplied to the second region are equal in said cleaning at least the inner wall of the process chamber.

9. The method as claimed in claim 1, further comprising:
cleaning at least an inner wall of the process chamber with the plasma of the cleaning gas after said ejecting the cleaning gas with the third flow rate being higher than the fourth flow rate,
wherein the cleaning gas includes fluorine.

10. The method as claimed in claim 9, further comprising:
additionally cleaning at least the inner wall of the process chamber with the plasma of the cleaning gas after said cleaning the at least the inner wall of the process chamber after said ejecting the cleaning gas with the third flow rate being higher than the fourth flow rate,
wherein the cleaning gas includes oxygen.

11. The method as claimed in claim 10, wherein a flow rate of the cleaning gas supplied to the first region and a flow rate of the cleaning gas supplied to the second region are equal in said additionally cleaning at least the inner wall of the process chamber.

12. The method as claimed in claim 9, wherein a flow rate of the cleaning gas supplied to the first region and a flow rate of the cleaning gas supplied to the second region are equal in said cleaning at least the inner wall of the process chamber.

13. The method as claimed in claim 1, wherein the gas supply part is a shower head formed inside the electrode plate.

14. The method as claimed in claim 1, further comprising:
transferring the substrate on which the reactive ion etching is performed out of the process chamber before said ejecting the cleaning gas with the first flow rate being lower than the second flow rate and said ejecting the cleaning gas with the third flow rate being higher than the fourth flow rate.

15. The method as claimed in claim 6, wherein the cleaning gas includes a reactive gas consisting of oxygen.

* * * * *